United States Patent [19]

Atwood et al.

[11] Patent Number: 5,737,265
[45] Date of Patent: Apr. 7, 1998

[54] PROGRAMMING FLASH MEMORY USING DATA STREAM ANALYSIS

[75] Inventors: Gregory E. Atwood, San Jose; Albert Fazio, Los Gatos, both of Calif.

[73] Assignee: Intel Corporation, Santa Clara, Calif.

[21] Appl. No.: 572,620

[22] Filed: Dec. 14, 1995

[51] Int. Cl.[6] ............................................. G11C 11/34
[52] U.S. Cl. ..................... 365/185.03; 365/185.24; 365/185.26; 365/185.29; 365/185.33
[58] Field of Search .................. 365/185.03, 185.24, 365/185.29, 185.33, 185.26; 395/600, 750

[56] References Cited

U.S. PATENT DOCUMENTS

| | | | |
|---|---|---|---|
| 4,181,980 | 1/1980 | MCoy | 365/45 |
| 4,357,685 | 11/1982 | Daniele et al. | 365/189 |
| 4,388,702 | 6/1983 | Sheppard | 365/104 |
| 4,415,992 | 11/1983 | Adlhoch | 365/94 |
| 4,890,259 | 12/1989 | Simko | 365/45 |
| 4,989,179 | 1/1991 | Simko | 365/45 |
| 5,043,940 | 8/1991 | Harari | 365/168 |
| 5,095,344 | 3/1992 | Harari | 357/23.5 |
| 5,126,967 | 6/1992 | Simko | 365/45 |
| 5,163,021 | 11/1992 | Mehrotra et al. | 365/185 |
| 5,172,338 | 12/1992 | Mehrotra et al. | 365/185 |
| 5,200,920 | 4/1993 | Norman et al. | 365/185 |
| 5,210,870 | 5/1993 | Baum et al. | 395/600 |
| 5,218,569 | 6/1993 | Banks | 365/189 |
| 5,220,531 | 6/1993 | Blyth et al. | 365/189 |
| 5,237,535 | 8/1993 | Mielke et al. | 365/218 |
| 5,262,984 | 11/1993 | Noguchi et al. | 365/185 |
| 5,287,305 | 2/1994 | Yoshida | 365/189 |
| 5,388,064 | 2/1995 | Khan | 365/45 |
| 5,394,359 | 2/1995 | Kowalski | 365/185 |
| 5,440,505 | 8/1995 | Fazio et al. | 365/218 |
| 5,481,731 | 1/1996 | Conary et al. | 395/750 |
| 5,487,033 | 1/1996 | Keeney et al. | 365/185 |
| 5,515,317 | 5/1996 | Wells et al. | 395/427 |
| 5,557,567 | 9/1996 | Bergemont et al. | 365/185.16 |
| 5,566,125 | 10/1996 | Fazio et al. | 365/45 |

FOREIGN PATENT DOCUMENTS

| | | |
|---|---|---|
| 0130614 | 1/1985 | European Pat. Off. |
| 56-60247 | 1/1983 | Japan. |

Primary Examiner—David C. Nelms
Assistant Examiner—Trong Quang Phan
Attorney, Agent, or Firm—Blakely, Sokoloff, Taylor & Zafman

[57] ABSTRACT

A method for programming an array of memory cells, wherein each memory cell has at least three possible states. The method comprises the steps of 1) analyzing a set of data to be programmed into the array of memory cells to determine destination states for each of the memory cells in the array, and 2) programming all memory cells to be programmed to a particular destination state, up to a maximum number of memory cells being programmed at any given time, until all memory cells having a particular destination state are programmed, whereupon all memory cells to be programmed to a next destination state are programmed in a like manner.

16 Claims, 16 Drawing Sheets

5,737,265

PROGRAMMING FLASH MEMORY USING DATA STREAM ANALYSIS

FIELD OF THE INVENTION

The present invention relates generally to memory devices and more particularly to methods for programming memory devices.

BACKGROUND OF THE INVENTION

Nonvolatile semiconductor memory is a fundamental building block for a typical computer system. One type of prior nonvolatile semiconductor memory device is the flash electrically-erasable programmable read-only memory ("flash EEPROM"), and one type of prior flash memory cell comprises a single field effect transistor ("FET") including a select gate, a floating gate, a source, and a drain. Information is stored in the flash cell by altering the amount of charge stored on the floating gate, which causes the threshold voltage $V_t$ of the flash cell to be varied. The flash memory cell is read by applying a select voltage via a wordline to the select gate. The amount of drain current $I_D$ that the flash memory cell conducts when the select voltage is applied is determined by the threshold voltage $V_t$ of the flash memory cell, and the state of the memory cell may be determined by comparing either the threshold voltage $V_t$, the drain current $I_D$, or the amount of charge stored on the floating gate to the same characteristic of a reference flash memory cell.

A typical prior flash memory cell stores only one bit of digital data, but flash memory cells that store more than one bit are known in the prior art. The number of bits stored by a flash memory cell depends on 1) the number of different analog states to which a flash memory cell may be placed by programming circuitry and 2) the number of different analog states that can be accurately determined by sensing circuitry.

Theoretically, there can be one analog state for each electron trapped on the floating gate, and a flash memory cell may be placed in a new state by simply trapping another electron on the floating gate; however, programming of a flash memory cell may be affected by environmental considerations and cell-to-cell variations. Environmental considerations similarly affect the operation of sensing a flash memory cell, and the resolution of sensing circuitry may not be fine enough to accurately discriminate between closely spaced analog states. Therefore, each state to which a memory cell may be placed typically corresponds to a range of charge and/or a corresponding range of threshold voltages or drain currents. Device characteristics confine the programming window, which is the total range of threshold voltages (or drain currents) that may be subdivided into two or more analog states, to a finite range such that requiring the discrimination between additional states narrows the range of threshold voltages (or drain currents) that each state may occupy. The "state width" of each analog state thus narrows.

FIG. 1 is a flow chart showing an exemplary prior art method for placing a flash memory cell having two possible analog states ("erased" and "programmed") to the programmed state. The flash array is initially erased such that each of the flash memory cells are in the erased state, and a flash memory cell is selected for being placed to the programmed state at process block 5. Typically, several memory cells are programmed in parallel.

A programming pulse, which comprises applying appropriate voltages to the select gate, source, and drain of each selected flash memory cell for a predetermined amount of time, is applied to the selected flash memory cell at process block 10. The duration of the programming pulse (the "pulse width") and the programming voltages determine the amount of charge that is added to the floating gate of the flash memory cell.

For some prior technologies, only a single programming pulse is used to place a memory cell in the programmed state. The programming method of FIG. 1, however, employs a program-verify paradigm that allows greater control of the programming process. At process block 15, a verify operation is performed wherein the state of the selected flash memory cell is sensed and compared to a reference. If the selected flash memory cell is not in the programmed state, programming pulses are applied to the selected flash memory cell until it is successfully placed to the programmed state. The process then ends at process block 20.

When the number of states for a flash memory cell exceeds two, it becomes important to accurately place the flash memory cell in the desired state without "program overshoot," which occurs when the flash memory cell is accidentally placed to a state beyond the desired state. Program-verify placement schemes are therefore desirable. Unfortunately, because state widths are narrowed, programming pulse widths should also be narrowed, which results in more programming pulses being applied and more verify operations being performed. The use of multiple verify operations can therefore lead to substantial overhead that degrades programming performance of the memory device.

SUMMARY AND OBJECTS OF THE INVENTION

Therefore, it is an object of the present invention to provide a method for more quickly placing a memory cell to a desired state.

This and other objects of the invention are provided by a method for programming an array of memory cells, wherein each memory cell has at least three possible states. The method comprises the steps of 1) analyzing a set of data to be programmed into the array of memory cells to determine destination states for each of the memory cells in the array, and 2) programming all memory cells to be programmed to a particular destination state, up to a maximum number of memory cells being programmed at any given time, until all memory cells having a particular destination state are programmed, whereupon all memory cells to be programmed to a next destination state are programmed in a like manner.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A number of methods for quickly placing a memory cell to one of three or more analog states are disclosed. These methods may be readily applied to memory cells that have only two possible analog states. As will also be discussed, some of the described methods may be used to quickly program memory cells to store analog data wherein the threshold voltage $V_t$ of the memory cell corresponds to an analog voltage. Wherein these methods are described with reference to flash EEPROMs, it should be noted that nonvolatile memory devices other than flash EEPROMs and volatile memory devices such as Dynamic Random Access Memories (DRAM) are capable of storing three or more analog states. Therefore, the disclosed methods may find similar application for memory devices other than flash EEPROMs.

Figure 1:
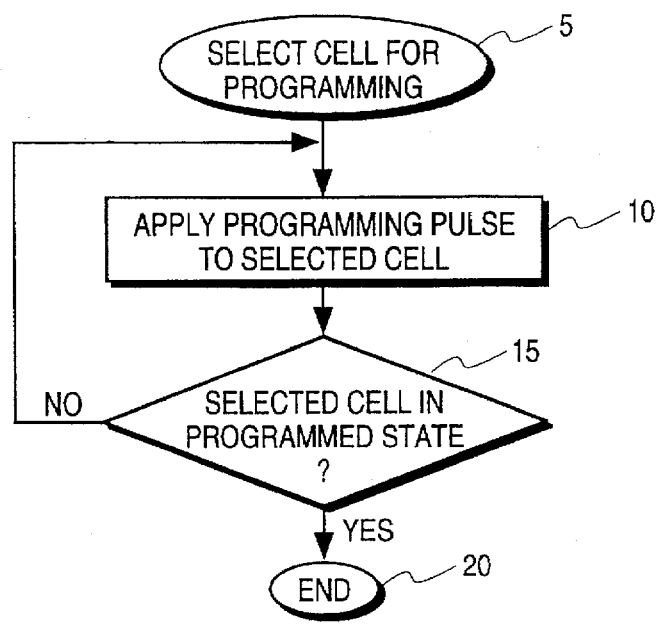
FIG. 1 shows a prior art program-verify programming method.
Figure 2:
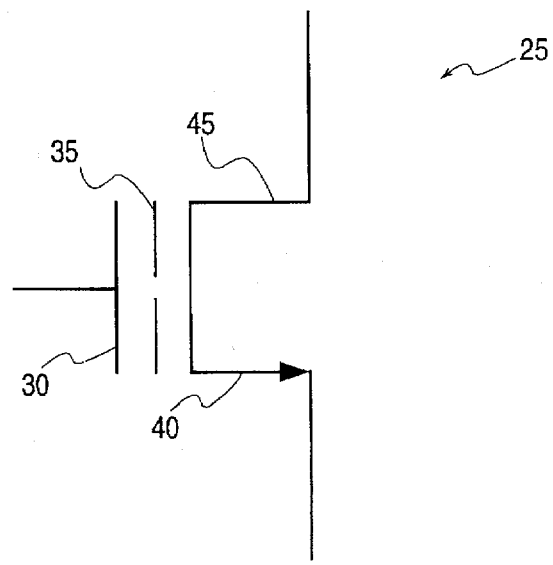
FIG. 2 shows a general nonvolatile memory cell.

FIG. 2 shows a nonvolatile memory cell 25 having a select gate 30, a floating gate 35, a source 40, and a drain 45. Nonvolatile memory cell 25 behaves as a field effect transistor having a threshold voltage $V_t$ that increases as charge is added to floating gate 35. The memory cell drain current $I_D$ ("cell current") decreases as the threshold voltage $V_t$ and cell charge level increase. The memory cell threshold voltage $V_t$ is related to the cell current $I_D$ by the expression:

$$I_D \propto G_m \times (V_G - V_t) \text{ for } V_D > V_G - V_t$$

$G_m$ is the transconductance of the memory cell;

$V_G$ is the memory cell gate voltage;

$V_D$ is the memory cell drain voltage; and $V_t$ is the memory cell threshold voltage.

Given this relationship, there are a number of different ways to sense the amount of charge (or "read" the data) stored on of the floating gate of the memory cell, including: sensing the cell current of a memory cell when a constant voltage is applied to the select gate of the memory cell; sensing the amount of voltage required at the select gate to give rise to an expected cell current for the memory cell; sensing a voltage drop across a load that is coupled to the drain of the memory cell when a constant voltage is applied to the select gate of the memory cell, wherein the cell current determines the amount of the voltage drop across the load; and sensing the amount of voltage required at the select gate to give rise to an expected voltage drop across a load that is coupled to the drain of the memory cell. To determine the analog state of the memory cell it is sufficient to compare a characteristic of the memory cell to a known reference.

Defining States For A Memory Cell

Generally, the physical characteristics of a nonvolatile memory cell require a minimum threshold $V_{tmin}$ to which the nonvolatile memory cell may be erased and a maximum threshold $V_{tmax}$ to which the nonvolatile memory cell may be programmed. The minimum threshold voltage $V_{tmin}$ and the maximum voltage $V_{tmax}$ delineate a maximum programming window for the non-volatile memory cell. The minimum threshold voltage $V_{tmin}$ is constrained by erase times and gate disturb voltages, and the maximum threshold voltage $V_{tmax}$ is constrained by drain disturb voltages and bake charge loss.

Wherein the maximum width of the programming window is determined by physical characteristics of the nonvolatile memory cell, the manner in which states are defined within the programming window is influenced by a number of factors, including the following:

1) temperature fluctuations during programming;
2) programming voltage fluctuations during programming;
3) location of the memory cell within the memory array;
4) random variations of channel length;
5) drain disturb;
6) gate disturb; and
7) the resolution of the circuitry used to sense the state of the nonvolatile memory cell.

Figure 3A:
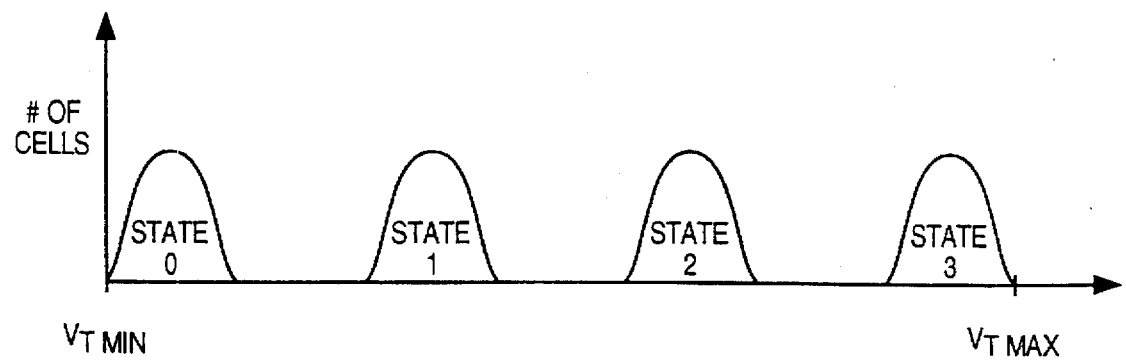
FIGS. 3A–3D show various alternative expressions for the states of a memory device.

FIGS. 3A–3D show alternative expressions and definitions of states within the same programming window. FIG. 3A shows a programming distribution of the number of cells in a given state versus the threshold voltage of that state. As shown, four states, State 0, State 1, State 2, and State 3 are defined within the programming window. For the purposes of illustration, the programming distribution for each state as shown is a bell curve wherein the majority of the cells programmed to a particular state fall within the center of the state. FIG. 3A further shows a number of separation ranges are shown between contiguous states. The separation ranges are provided in order to more easily discriminate between states; however, separation ranges are theoretically not required. The state widths and the separation range widths are shown as being equal such that each state and each separation range defines one-seventh of the programming window.

Figure 3B:
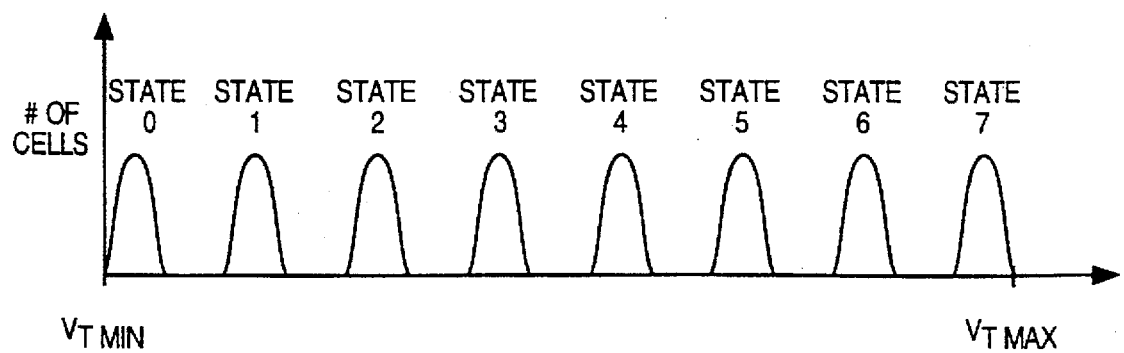
Figure 3C:
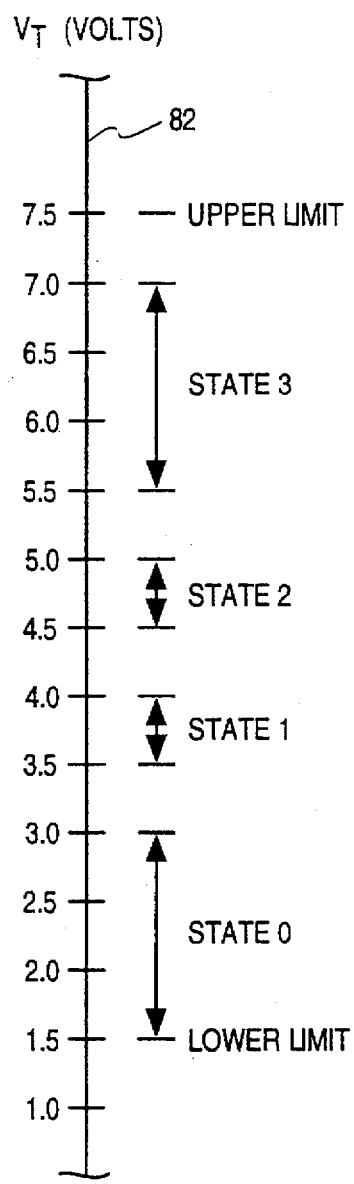
Figure 3D:
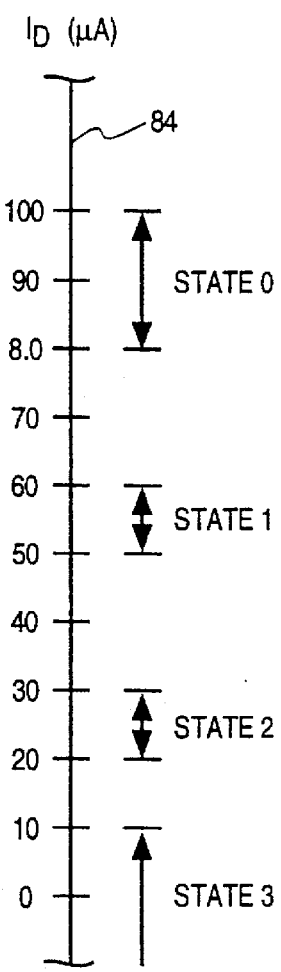

FIG. 3B shows a programming distribution of memory cells wherein eight states are defined within the programming window. Again, each state and each separation range is shown as defining an equal range of threshold voltages $V_t$ such that each state and each separation range occupies one-fifteenth of the total programming window.

Wherein the state width and separation range width for FIGS. 3A and 3B are shown as being equal, state width and separation range width may be defined somewhat more arbitrarily, and other considerations may limit the manner in which states may be defined. For example, for states closer to the edge of the programming window, it may be desirable to provide a larger state width. FIG. 3C shows State 0 and State 3 as occupying threshold voltages ranges of 1500 mv, wherein State 1 and State 2 each have a state width of only 500 mv. FIG. 3D shows the equivalent state distribution for FIG. 3C in terms of the cell current $I_D$.

FIGS. 3A–3D illustrate possible state distributions for digital data storage applications. The same memory cell having the same programming window may be used to store analog data for applications such as sound recording and playback. For analog storage applications each threshold voltage $V_t$ or cell current $I_D$ within the programming window corresponds directly to an analog input voltage such that sensing the actual $V_t$ of the memory cell allows the direct synthesis of the input voltage by output circuitry. In this manner, sound may be recorded and played back. Examples of prior analog storage architectures may be found in U.S. Pat. No. 4,890,259, entitled "High Density Integrated Circuit Analog Signal Recording and Playback System," and U.S. Pat. No. 5,126,967, entitled "Writable Distributed Non-Volatile Analog Reference System and Method For Analog Signal Recording and Playback."

Programming Characteristics of Flash Memory

Figure 4:
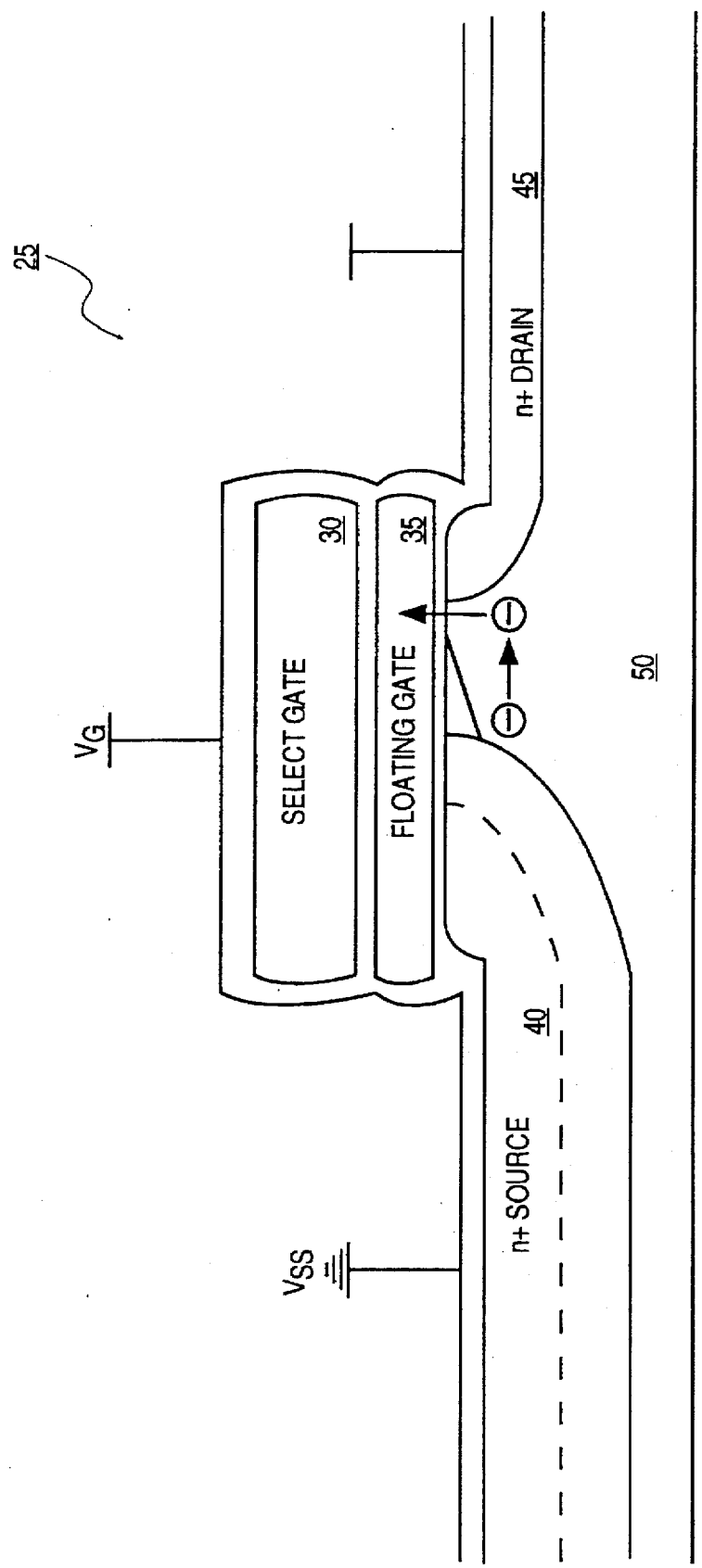
FIG. 4 shows a flash memory cell configured for programming.

FIG. 4 shows a flash memory cell configured for programming by hot electron injection. The select gate 30 of flash memory cell 25 is connected to a programming voltage $V_G$. A typical programming voltage for prior flash memory cells is 12.0 volts.

Applying the programming voltage $V_G$ to the select gate 30 switches the FET of the flash memory cell on, causing current to flow from the drain 45 to the source 40. The programming voltage $V_G$ also creates a "vertical" electric field between the substrate 50 and the floating gate 35. Electron flow in the vertical electric field is depicted as an arrow having its head at floating gate 35 and its tail at substrate 50. This substantially shows the direction of electron flow in the vertical electric field.

As shown, source 40 is coupled to system ground VSS, and drain 45 is coupled to a drain voltage $V_D$. The difference in potential between the drain 45 and the source 40 creates a "horizontal" electric field that accelerates electrons from the source 40 across the channel towards the drain 45. For one embodiment, it is sufficient for $V_D$ to be 5–7 volts greater than the voltage at source 40. Electron flow in the horizontal electric field is shown as an arrow having its head at drain 45 and its tail at source 40. This substantially shows the direction of electron flow across the channel. The accelerated or "hot" electrons collide with the lattice structure of the substrate 50, and some of the hot electrons are swept onto the floating gate by the vertical electric field. In this manner, the amount of charge stored on the floating gate may be increased.

The state to which a non-volatile memory is placed is determined by the gate voltage $V_G$, the drain voltage $V_D$, the effective channel length $L_{eff}$ of the memory cell, temperature, and pulse width, wherein the pulse width is the duration for which the programming gate voltage $V_G$ and the programming drain voltage $V_D$ are applied to the memory cell. As will now be discussed, the programming gate voltage $V_G$ is of primary significance.

Figure 5:
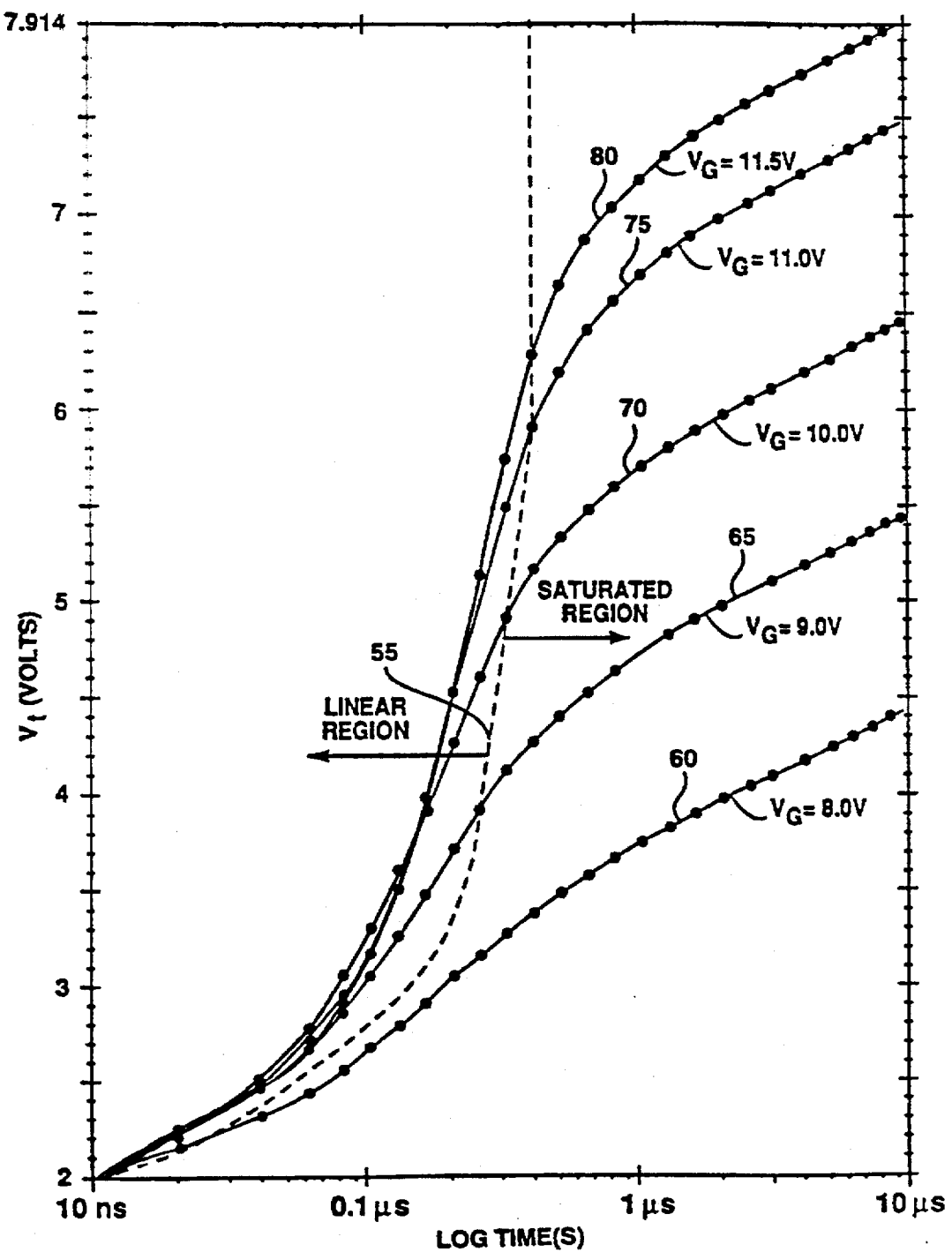
FIG. 5 shows a family of programming curves wherein the programming drain voltage is held constant and the programming gate voltage is varied.

FIG. 5 graphs memory cell threshold voltage $V_t$ versus the log of programming time for different programming gate voltages $V_G$. The programming gate voltage $V_G$ determines the relative strength of the vertical electric field, and increasing programming gate voltage $V_G$ increases the strength of the vertical electric field during programming. Curve 60 shows threshold voltage $V_t$ given a programming gate voltage $V_G$ of 8 volts. Curve 65 shows threshold voltage $V_t$ for a programming gate voltage $V_G$ of 9 volts. Programming gate voltages $V_G$ of 10 volts, 11 volts, and 11.5 volts results in curve 70, 75, and 80, respectively.

All five curves 60–80 show the threshold voltage $V_t$ increasing exponentially in the "linear region" to the left of curve 55. The linear region is so named because when threshold voltage $V_t$ is plotted on a linear time scale, the threshold voltage $V_t$ increases linearly with $V_G$ while programming in the linear region. Thus, the threshold voltage $V_t$ increases greatly given a small increase in programming pulse duration when programming in the linear region, and precise control of the threshold voltage $V_t$ is difficult.

Precise control of the threshold voltage $V_t$ is easier when programming is performed in the "saturated region" to the right of curve 55. As shown, threshold voltage $V_t$ increases more slowly, logarithmically, with time when the cell is programmed in the saturated region.

Programming of memory cell while operating in the saturated region is slow if the gate voltage $V_G$ is maintained constant and the total programming pulse duration is increased. For example, given an initial programming pulse of 1 μs duration and having a programming gate voltage $V_G$ of 8.0 volts, the threshold voltage $V_t$ of the memory cell is approximately 3.7 volts. If the programming gate voltage $V_G$ is maintained at 8.0 volts, a programming pulse of approximately 10 μs duration is required to raise the threshold voltage $V_t$ by 1.0 volt to 4.7 volts.

Programming in the saturated region occurs much more quickly if the gate voltage $V_G$ is increased with each subsequent programming pulse. In fact, as may be seen in FIG. 5, increasing the gate voltage $V_G$ while programming in the saturated region results in the threshold voltage $V_t$ increasing by approximately the same amount for a constant pulse width. Thus, given the initial 1 μs programming pulse with $V_G$ equal to 8.0 volts, a subsequent 1 μs programming pulse with $V_G$ equal to 9.0 volts will raise the $V_t$ of the memory cell from 3.7 volts to 4.7 volts, a one-to-one correspondence between the increase in $V_G$ and the increase in $V_t$.

Figure 6:
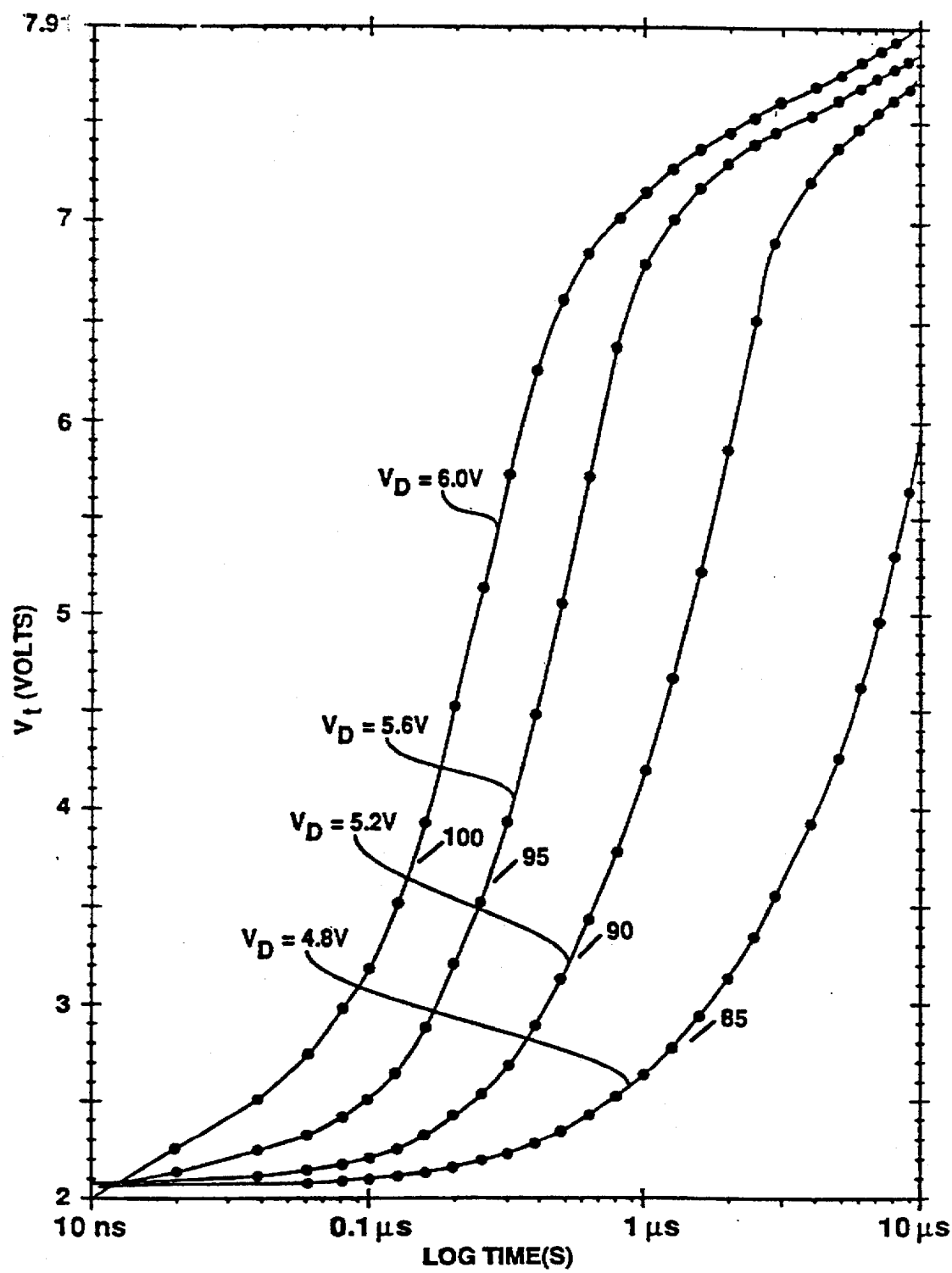
FIG. 6 shows a family of programming curves wherein the programming gate voltage is held constant and the programming drain voltage is varied.

The curves of FIG. 5 assume a fixed programming drain voltage $V_D$, which is the source of the horizontal electric field across the channel. FIG. 6 shows a family of curves given a constant programming gate voltage $V_G$ and a multiplicity of programming drain voltages $V_D$. As shown, the drain voltage $V_D$ affects the time when the memory cell enters the saturated region of programming. Different channel lengths result in a different family of curves; however, equivalent behavior for memory cells having different effective channel lengths may be achieved by trimming the programming drain voltage $V_D$.

Figure 7:
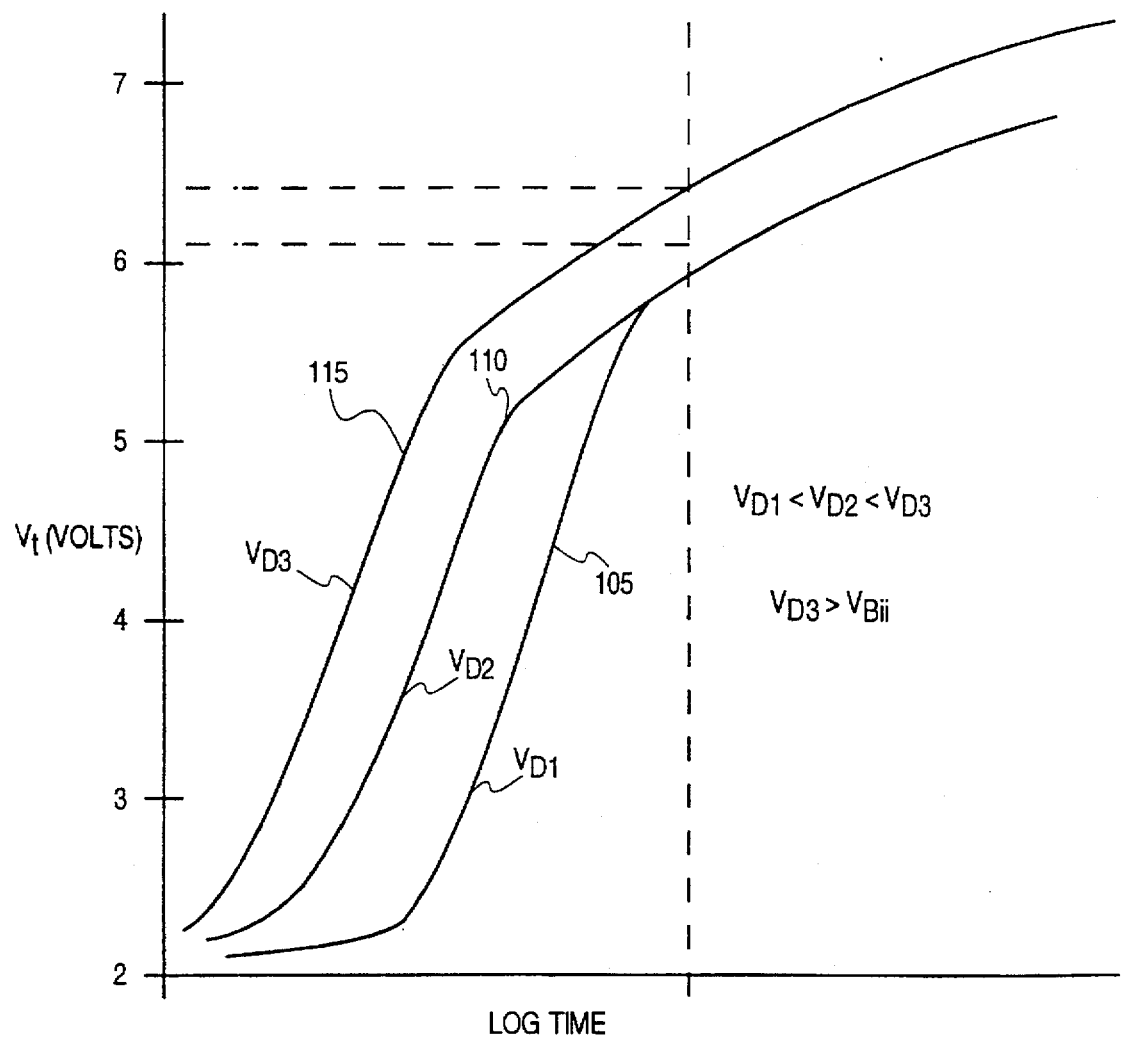
FIG. 7 shows the effect of impact ionization on the maximum drain bias voltage of one type of flash cell.

The impact ionization induced Bi-polar turn-on voltage ($V_{Bii}$) limits the maximum drain bias voltage level that can be used while programming via hot electronic injection. FIG. 7 illustrates the effect of $V_{Bii}$ upon threshold voltage $V_t$. The programming gate voltage VG is the same for each of the current $V_{D1}$, $V_{D2}$, and $V_{D3}$. For drain bias voltage levels less than $V_{Bii}$, increasing $V_D$ only affects the linear region of the $V_t$ verses time curve, as shown by the merging of curve $V_{D2}$ into the curve for $V_{D1}$. Maximum threshold voltage levels in the saturated region are unaffected by the increase in drain bias voltages levels. When the drain bias voltage $V_D$ is greater than $V_{Bii}$, the threshold voltage levels in the saturated region are also raised.

Exemplary Memory Device

Figure 8:
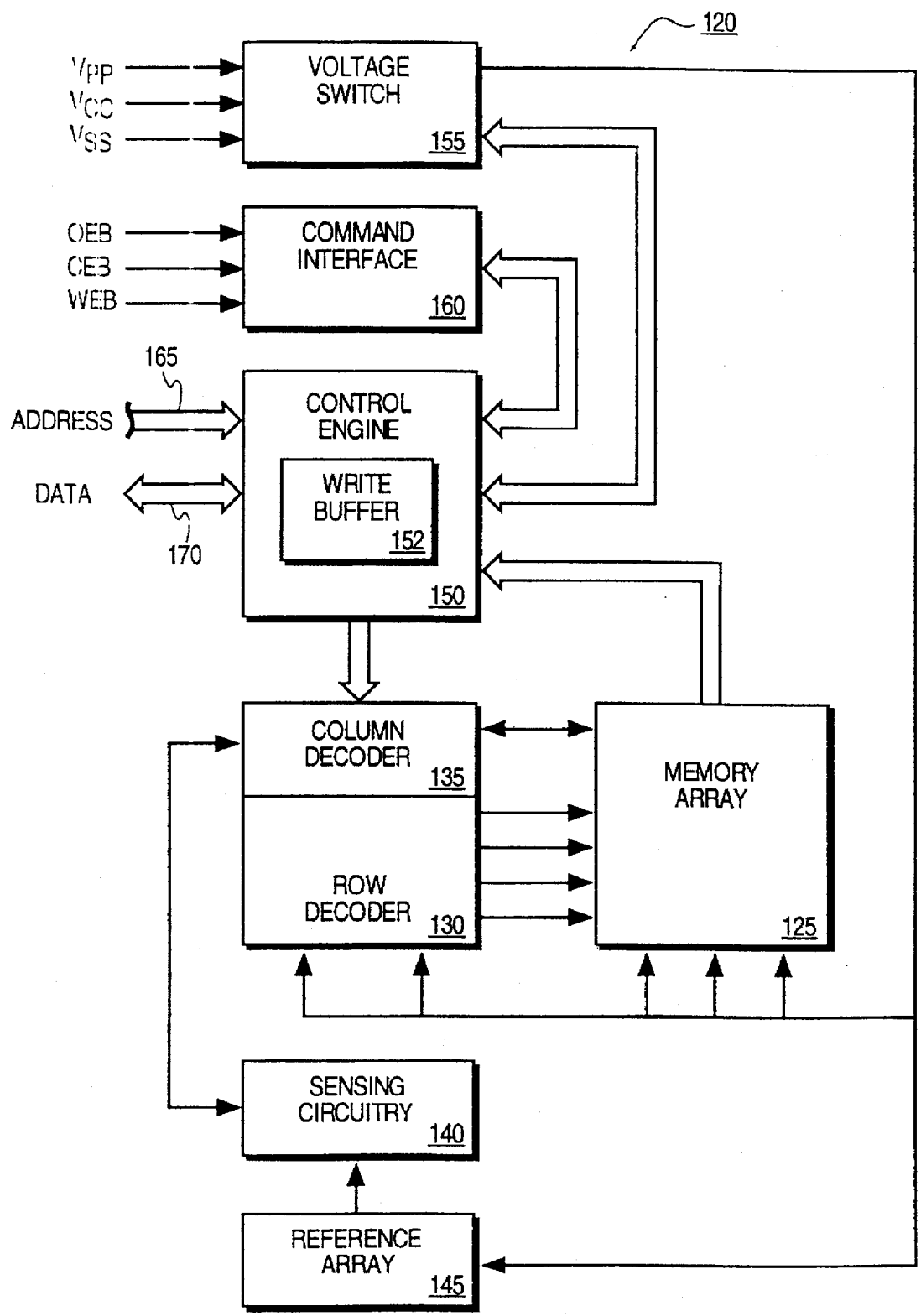
FIG. 8 shows a memory device that may be programmed according to the disclosed programming methods.

The generalized placement methods described herein are described with respect to an exemplary memory device shown in FIG. 8. Memory device 120 is fabricated on a single semiconductor substrate and includes memory array 125, row decoder 130, column decoder 135, sensing circuitry 140, reference array 145, control engine 150, voltage switch 155, and command interface 160. Memory device 120 receives addresses via address lines 165 and receives and outputs data via bi-directional data lines 170. Data is stored using nonvolatile memory cells within memory array 125, wherein memory array 125 may include any type of memory cell with programmable threshold voltages, such as memory cells with trapping dielectrics or floating gates. Wherein memory device 120 is nonvolatile, control engine 150 may further include a write buffer 152 comprising SRAM for temporarily storing data with which to program memory array 125. The maximum allowable power consumption of memory device 120 is a primary factor in determining the maximum number of memory cells that may be programmed at any one time, and write buffer 152 is typically selected to store at least enough data to program a maximum number of cells at a time.

To read data stored in the memory array 125, row decoder 130 and column decoder 135 select a number of memory cells of the memory array 125 in response to a user-provided address received via address lines 165. Row decoder 130 selects the appropriate row of memory array 125, and column decoder 135 selects the appropriate column (or columns) of memory array 125. Sensing circuitry 140 compares the states of the selected memory cells to the states of reference cells of reference array 145. Sensing circuitry 140 may include differential comparators that output digital logic voltage levels in response to the comparisons between memory cells and reference cells. Thus, the analog states of the memory cells may be expressed and output as digital data. The precise $V_t/I_D$ of a selected memory cell may be similarly determined.

Control engine 150 controls the erasure and programming of memory array 125. For one embodiment, control engine 150 includes a processor that is controlled by microcode stored in on-chip memory. Alternatively, the control engine 150 may be implemented as a state machine or by using combinational logic. Control engine 150 may also be implemented as a semiconductor device that externally controls the operation of memory device 120. The particular implementation of control engine 150 does not affect the described methods of programming of memory cells.

Control engine 150 manages memory array 125 via control of row decoder 130, column decoder 135, sensing circuitry 140, reference cell array 145, and voltage switch 155. Voltage switch 155 controls the various voltage levels necessary to read, program, and erase memory array 125. User commands for reading, erasure, and programming are communicated to control engine 150 via command interface 160. The external user issues commands to command interface 160 via three control pins: output enable OEB, write enable WEB, and chip enable CEB.

Exact Placement Programming

Figure 9:
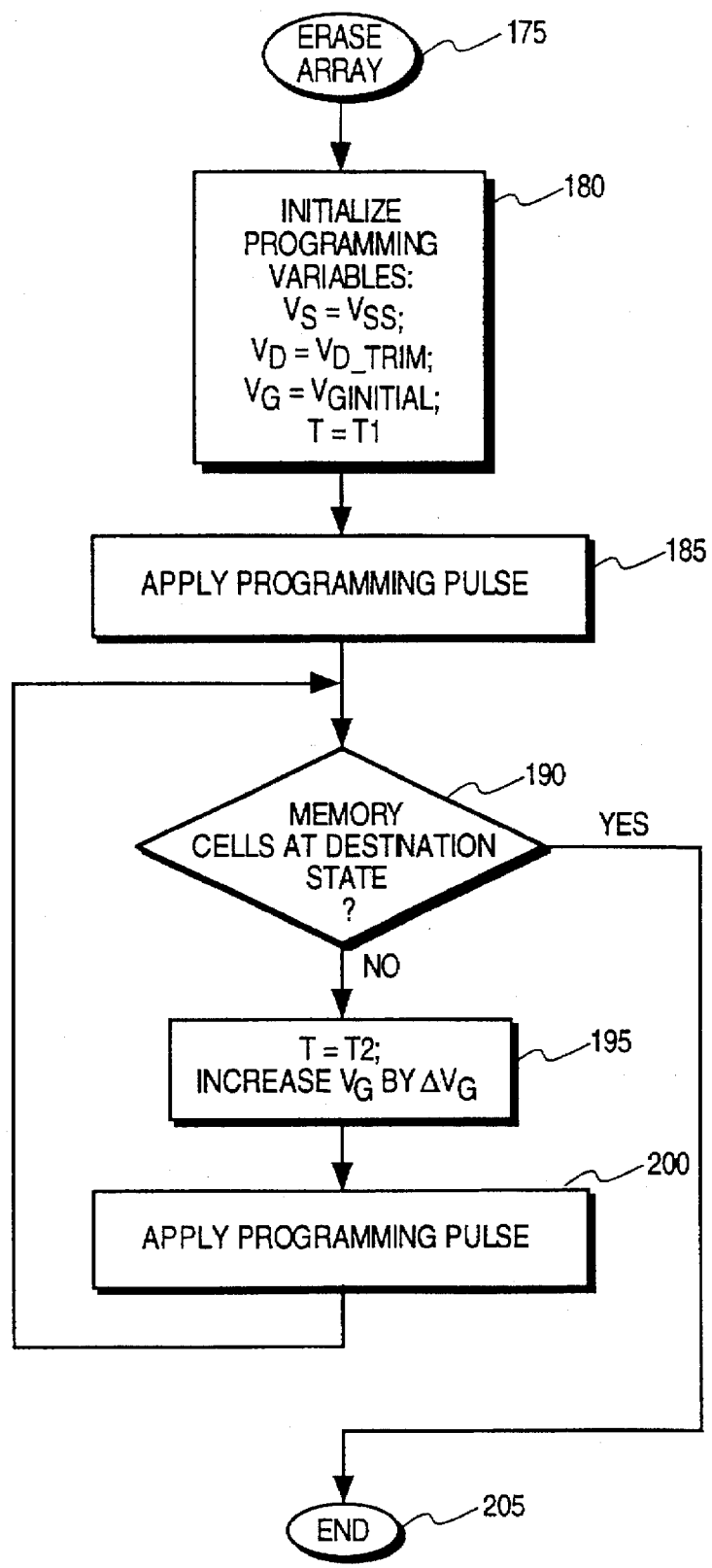
FIG. 9 shows an exact placement method of programming.

FIG. 9 is a flow diagram showing an "exact placement" method for programming a number of memory cells in parallel. The method may be alternatively used to sequentially and individually program multiple memory cells. This exact placement method is described in more detail in U.S. Pat. No. 5,440,505, which is commonly assigned to Intel Corporation of Santa Clara, Calif.

The method begins at process block 175 wherein memory array 125 is erased such that all of the memory cells are in a known state prior to programming. The step of erasing is not required if some other mechanism for ensuring that the states of the selected cells are known prior to programming is provided. At process block 180, the control engine 150 initializes the programming variables including the source voltage $V_S$, the drain voltage $V_D$, the gate voltage $V_G$, and the pulse width T. As shown in FIG. 9, the source voltage $V_S$ is initialized to system ground $V_{SS}$, the drain voltage $V_D$ is initialized to the trimmed drain voltage $V_{D\_TRIM}$, the gate voltage $V_G$ is initialized to $V_{G\_INITIAL}$, and the pulse width T is initialized to a first pulse width $T_1$. The initial gate voltage $V_{G\_INITIAL}$ and the initial pulse width $T_1$ are selected such that application of a single pulse will result in programming each selected memory cell to the saturation region for the initial gate voltage $V_{G\_INITIAL}$.

At process block 185, an initial programming pulse is applied to the selected memory cells. A verify operation is undertaken at process block 190 wherein it is determined whether each memory cell in the selected subset of memory cells is at the destination state. If a memory cell is at the destination state, the process for that memory cell ends at process block 205. In order to avoid program overshoot the initial programming voltage $V_{G\_INITIAL}$ and the initial pulse with $T_1$ are selected such that an initial pulse will not result in programming to the desired state. Thus, the process continues at process block 195, wherein the control engine 150 reduces the pulse width to a time $T_2$ and increases the gate voltage $V_G$ by a gate step voltage $\Delta V_G$. An additional programming pulse is applied to the memory cell or cells at process block 200, wherein the gate voltage is equal to $V_G + \Delta V_G$, and the pulse width is equal to $T_2$. Another verify step is undertaken at process block 190. If the memory cell is at the destination state, programming for that memory cell ends at process block 205. Any remaining memory cells that have not achieved their destination state repeat process steps 195 and 200. In this manner, the gate voltage is gradually increased for each programming pulse.

The gate step voltage $\Delta V_G$ and the pulse width $T_2$ are selected such that there will be a one-to-one correspondence between an increase in gate voltage $V_G$ and an increase in threshold voltage $V_t$. For example, if the gate step voltage is 300 mv, the threshold voltage $V_t$ of a memory cell that is being programmed will be raised by 300 mv each time a programming pulse with an increased gate voltage is applied. The gate step voltage $\Delta V_G$ and the pulse width 72 are further selected to result in programming in the saturation region for the programming gate voltage $V_G$.

The relationship between threshold voltage $V_t$ and programming gate voltage $V_G$ follows directly from the curves shown in FIG. 5. The amount of reduction from the initial pulse width $T_1$ to the subsequent pulse width $T_2$ depends on state widths and the magnitude of the gate step voltage $\Delta V_G$. The amount of reduction in pulse width tends to increase as state widths and gate step voltage $\Delta VG$ decrease.

Figure 10:
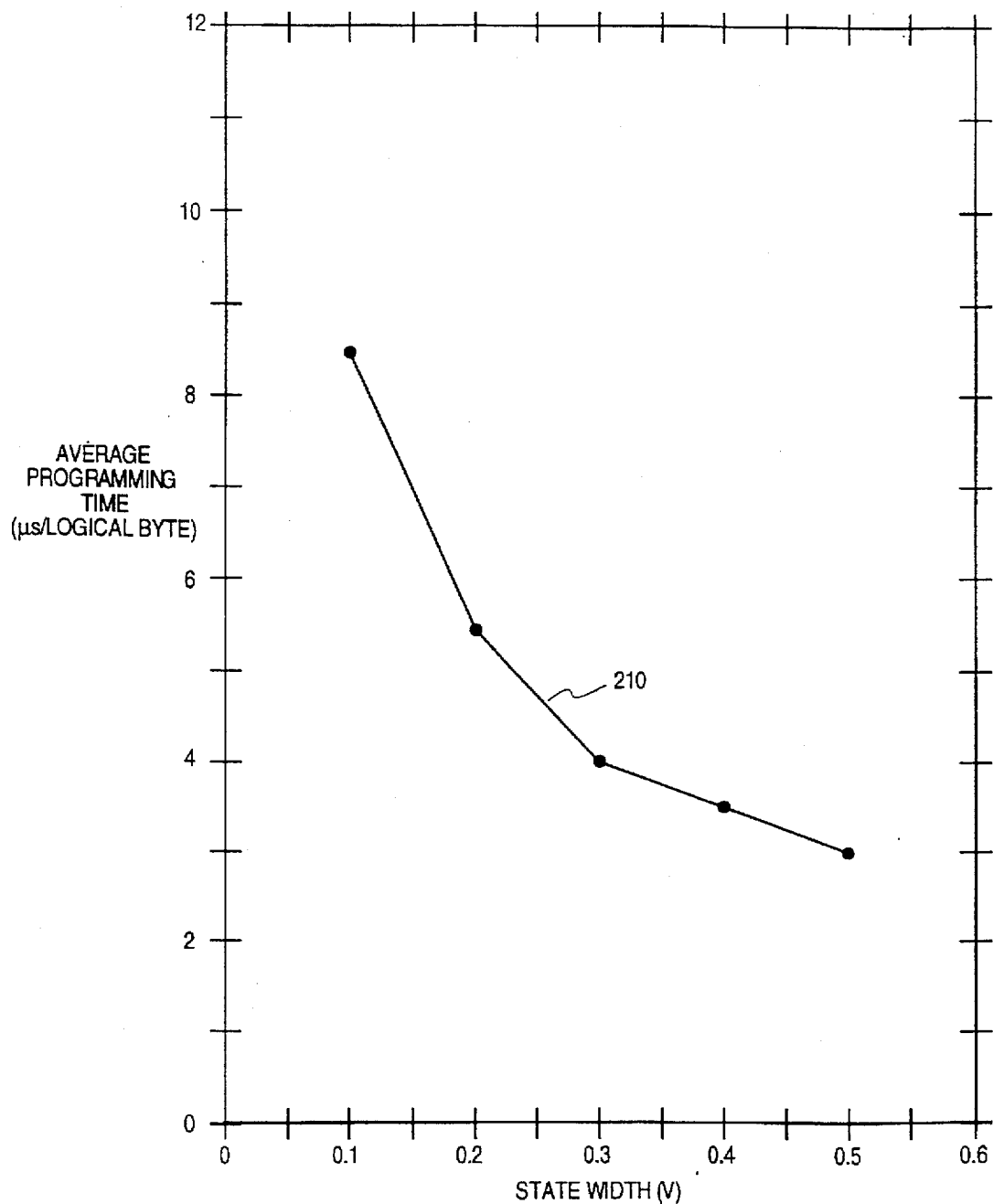
FIG. 10 shows average programming time as a function of state time using an exact placement method.

The exact placement method shown in FIG. 9 is a robust method that is easy to implement. Unfortunately, given a small state width, a large number of programming pulses must be performed. Furthermore, verify operations, which are essentially read operations, must be undertaken after each programming pulse. As shown in FIG. 10, the average programming time for programming a logical byte of memory cells increases as the state width decreases. This average programming time is a function of pulse width, the number of pulses, voltage settling time, verify time, and control engine overhead. Given a fixed programming window, state width must be decreased if additional states are to be discriminated. Therefore, an increase in average programming time is inevitable, and it is desirable to find alternative methods for programming memory cells having multiple analog states.

There are a number of ways to decrease the average programming time. For example, the number of pulses may be reduced. Alternatively, the number of verify operations may be reduced, or the state machine overhead may be distributed across the entire array.

Learning Methods

One manner in which to reduce overall programming time is for control engine 150 to "learn" the programming characteristics of the memory array. According to a first type of learning algorithm, a statistically significant subset of memory cells for the array are programmed using an exact placement method, and control engine 150 derives characterization information regarding the average programming times for the array from the programming of the subset of cells. Characterization information may include the average number of pulses required to achieve specific destination states given the pulse width parameters of the exact placement algorithm. Alternatively, characterization information may simply be the derivation of the $V_t$-versus-time characteristics of a memory cell such as the family of curves 60–80 shown in FIG. 5. An alternative learning method is predictive in nature, and requires deriving characterization information for each cell during programming. Learning methods assume that environmental variables are held constant during programming.

Distributed Learning Methods

Figure 11:
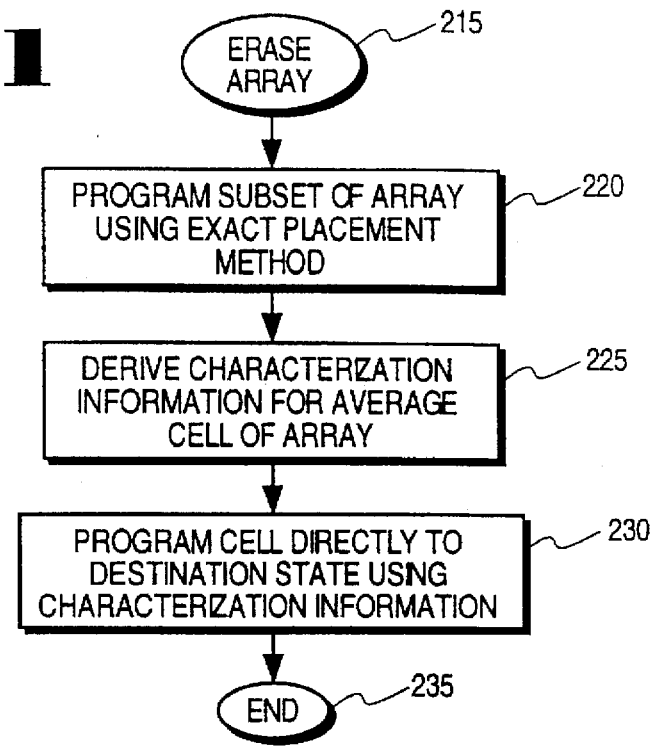
FIG. 11 shows a distributed learning method of programming according to one embodiment.

FIG. 11 is a flow chart showing a distributed learning method. Prior to programming, the array is erased at process block 215. At process block 220, control engine 150 programs a subset of the array using an exact placement or similar method. At process block 225, the control engine 150 derives characterization information for an average cell of the array. Once the characterization information has been determined the selected cells may be programmed directly to the desired state. By direct programming it is meant that no verify operations are undertaken to achieve the destination state. This may mean that a single pulse is used to program cells to the destination state, wherein the gate voltage $V_G$ and the pulse width T are selected such that programming occurs in the saturation region. For example, if the family of curves shown in FIG. 5 has been derived, a single pulse of 1 μs duration with a gate voltage $V_G$ of 11.0 volts will place a cell directly to State 3 as defined by FIG. 3C. Alternatively, direct programming may involve the application of a series of pulses as specified by the exact placement method of FIG. 10 without performing verify operations. At process block 230, control engine 150 directly programs each of the array cell to its destination state using the characterization information. The distributed learning method ends at step 235.

Figure 12:
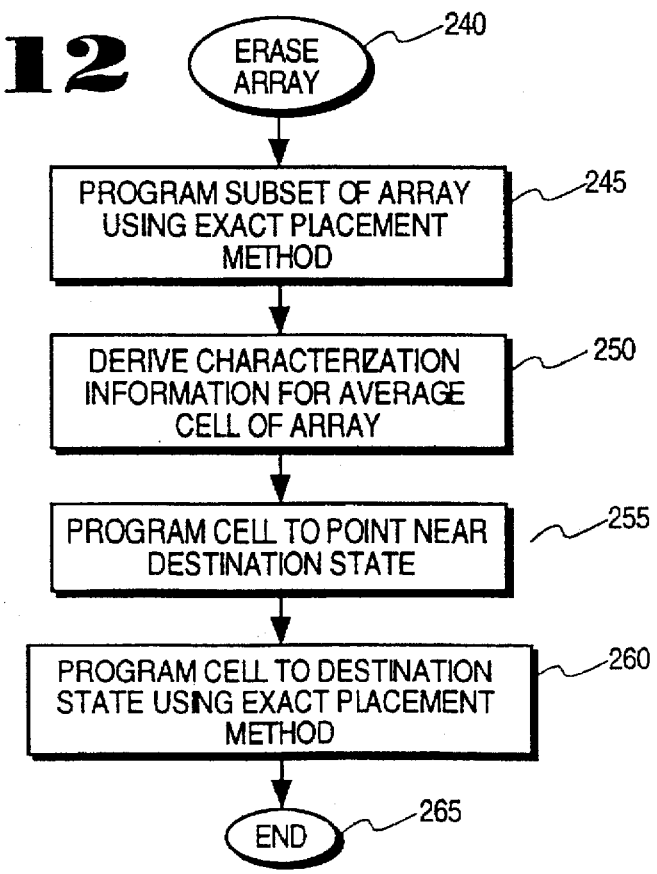
FIG. 12 shows a distributed learning method of programming according to an alternative embodiment.

FIG. 12 is a flow chart showing a distributed learning method according to an alternative embodiment. The array is erased by control engine 150 at process block 240. Control engine 150 programs a subset of the array using an exact placement method at process block 245. At process block 250, control engine 150 derives characterization information for an average cell of the array. At process block 255, the control engine programs the cell to a point near the destination state, which provides a guardband against programming overshoot for memory cells that abnormally deviate from the average memory cell. The control engine finishes programming the cell to the designation state using the exact placement method at 260, and the distributed learning method ends at process block 235.

The overall programming time is greatly reduced for both types of distributed learning methods when compared to the previously described exact placement method. Much of this time savings is provided by eliminating verify operations.

Predictive Learning

Figure 13:
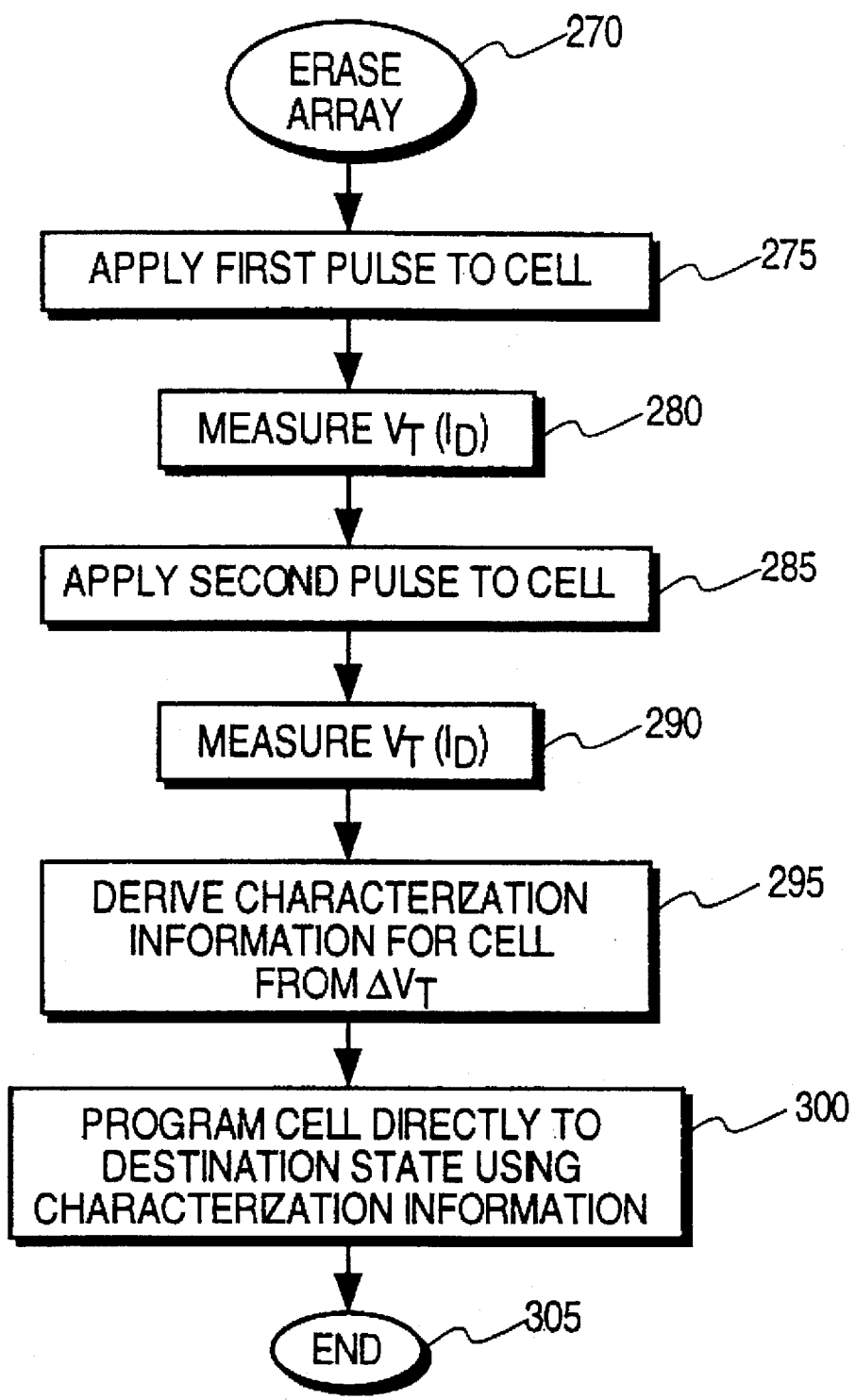
FIG. 13 shows a predictive learning method of programming according to one embodiment.

FIG. 13 is a flow chart showing a predictive learning method according to one embodiment. Unlike distributed learning, predictive learning is performed for each individual cell. Thus, the family of programming curves is individually determined for each memory cell.

Control engine 150 begins by erasing the array at process block 270. A first programming pulse is applied to a memory cell by control engine 150 at process block 275. Control engine 150 determines the threshold voltage $V_t$ after applying the first pulse at process block 280. Such a determination may be made simply by performing a verify operation. Alternatively, the control engine may determine the drain current $I_D$.

Control engine 150 applies a second pulse to the memory cell at process block 285, and the control engine 150 again determines the threshold voltage $V_t$ at process block 290. The control engine 150 may subtract the threshold voltage $V_t$ measured after the first pulse from the threshold voltage $V_t$ measured after the second pulse to determine a difference voltage $\Delta V_t$, which the control engine may use to predict the $V_t$-versus-time characteristics for the memory cell. Thus, at process block 295, control engine 150 derives characterization information for the cell from the difference voltage $\Delta V_t$. Control engine 150 may then program the cell directly to the destination state using the characterization information, and the predictive learning method ends at process block 305.

The two characterizing programming pulses are preferably selected to result in saturation region programming. For example, the two characterizing pulses may be performed according to the exact placement method of FIG. 9. If the selected memory cells are placed to a known value of $V_t/I_D$ prior to programming, only one characterizing pulse is required.

Figure 14:
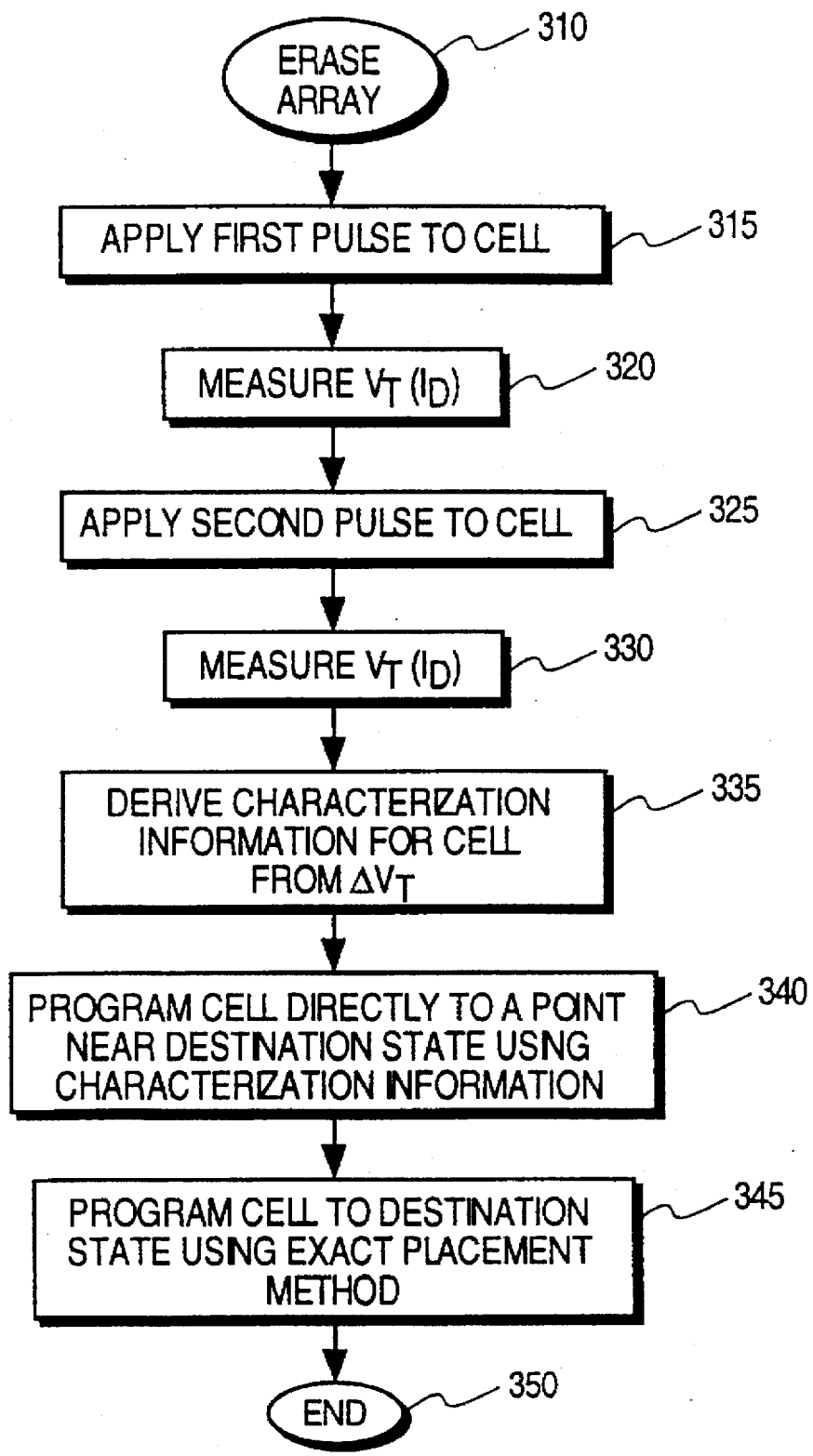
FIG. 14 shows a predictive learning method of programming according to an alternative embodiment.

FIG. 14 is a flow chart showing a predictive learning method according to an alternative embodiment. Control engine 150 erases the array at process block 310 and applies a first programming pulse to a memory cell at process block 315. The control engine 150 measures the threshold voltage $V_t$ after the first pulse at process block 320. The control engine 150 then applies a second programming pulse to the memory cell at process block 325 and measures the threshold voltage at process block 330. The control engine 150 derives characterization information from the cell using the difference voltage $\Delta V_t$ at process block 335. Control engine 150 then programs the memory cell directly to a point near the destination state for the memory cell using the derived characterization information such that no verify operation is required. This occurs at process block 340. At process block 345, control engine 150 completes programming of the memory cell using an exact placement method such as that shown in FIG. 10. The process ends at process block 350.

Predictive learning methods are especially well suited for quickly storing analog voltages in the memory array. For example, wherein the desired final threshold voltage $V_t$ for the memory cell is $V_{t\_target}$, the programming voltage $V_{GC}$ of the characterizing pulse may be given by the following equation:

$$V_{GC}=V_{t\_target}+c$$

wherein c is a constant selected such that the characterizing pulse cannot result in overshoot of $V_{t\_target}$. According to one embodiment c is equal to 3.5 volts.

Once the threshold voltage $V_{tc}$ after the characterization pulse has been determined, the programming voltage $V_{GP}$ of the programming pulse is determined by simply determining the differences between $V_{t\_target}$ and $V_{tc}$, increasing $V_{GC}$ by the same amount. This is shown by the following equation:

$$V_{GP}=V_{GC}+(V_{t\_target}-V_{tc})$$

Distributed learning methods may find similar application when storing analog data in nonvolatile media.

Relative Placement Methods

Exact placement methods and learning methods may be characterized as "absolute placement" methods because the states are defined in an objective manner using predefined reference values. An alternative type of placement method is a "relative placement" method. Wherein absolute placement methods contemplate well defined state boundaries and separation ranges, relative placement methods require only that states are defined relative to one another. For example, given a four state memory cell wherein the lowest state is State 0 and the highest state is State 3, it is sufficient that a gate voltage associated with each state follow the following order:

$$V_{G0} < V_{G1} < V_{G2} < V_{G3}$$

wherein $V_{G0}$ defines threshold voltage for a memory cell in state 0, $V_{G1}$ defines the threshold voltage for a memory cell in State 1, $V_{G2}$ defines the threshold voltage for a memory cell in State 2, and $V_{G3}$ defines the threshold voltage for a memory cell in State 3. Practically speaking, each state must still define a range of voltages, and the range of voltages must be guardbanded such that the largest threshold voltage of one state is not greater that the smallest threshold voltage of the next state.

Programming using such an ordering of states method merely entails applying one pulse at the selected gate voltage for the state to place the memory cells in the desired state. The pulse width should still be selected such that saturation programming occurs for the given value of programming gate voltage.

Figure 15:
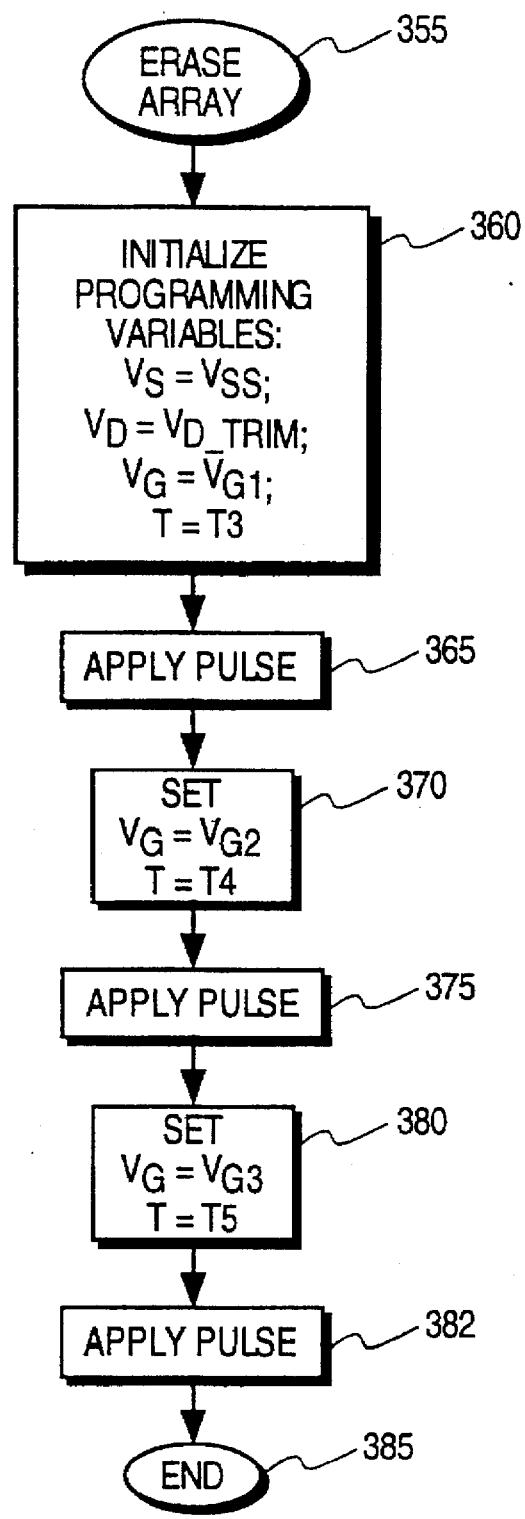
FIG. 15 shows a relative placement method of programming.

FIG. 15 is a flow chart showing an ordering of states method. Control engine 150 erases the array at processing block 355. The programming variables are initialized at processing block 360, wherein the gate voltage is initialized to be $V_{G1}$ and the pulse width is T3. The pulse width T3 is selected such that saturation programming occurs for the programming gate voltage of $V_{G1}$. Control engine 150 applies a pulse to a selected cell or cells at process block 365 to place the cells in State 1. At process block 370 control engine 150 sets the programming voltage to $V_{G2}$ and the pulse width to T4, wherein T4, is selected to result in saturation programming for a programming gate voltage of $V_{G2}$. At process block 375, control engine 150 applies a programming pulse to place selected cells in State 2. At process block 380, control engine 150 sets the programming gate voltage to $V_{G3}$ and sets the pulse width to T5, wherein T5 is selected to result in saturation programming given the programming gate voltage $V_{G3}$. A pulse is applied at process block 382 to place selected cells in State 3, and the ordering programming process is completed at process block 385. No verify operations are required.

The process shown in FIG. 15 may be formed in a "carry along" manner wherein all cells of the array that are to be programmed receive all programming pulses until they have received the programming pulse that places them to the desired state. For example, the first programming pulse is applied to all the cells of the array that are to be programmed. Those cells that are to be programmed only to the State 1 are deselected to prevent further programming, and all cells that are to be programmed to State 2 and subsequent states receive the second pulse. State 2 cells receive no further programming.

The process of FIG. 15 may be alternatively performed such that cells only receive the programming pulse that places them in their destination state. Predictive learning techniques may be applied to ensure that each programming pulse programs the selected memory cells in the saturated region.

Data Stream Analysis Methods

An alternative type of placement method reduces overall programming time by maximizing the number of memory cells that are programmed at any given time. Programming is often performed on a "block" by block basis, wherein a block of memory cells typically corresponds to a single addressable byte or word of data. The programming of a block of memory cells occurs within a single "programming cycle." The maximum number of cells that may be programmed in a single programming cycle (i.e. the number of cells in a block) is typically limited by the maximum power budget of memory device 120.

Statistically, the data stored in a block of memory cells is random and may include cells that are to remain in the erased state (State 0) as well as cells that are to be programmed. Therefore, programming by block typically results in less than all of the memory cells of a block being programmed per programming cycle. For memory cells having only two states, only half of the cells of a block are programmed per programming cycle, on average. For memory cells having n states, only 1/n of the cells of a block are programmed to a particular state, on average.

Figure 16:
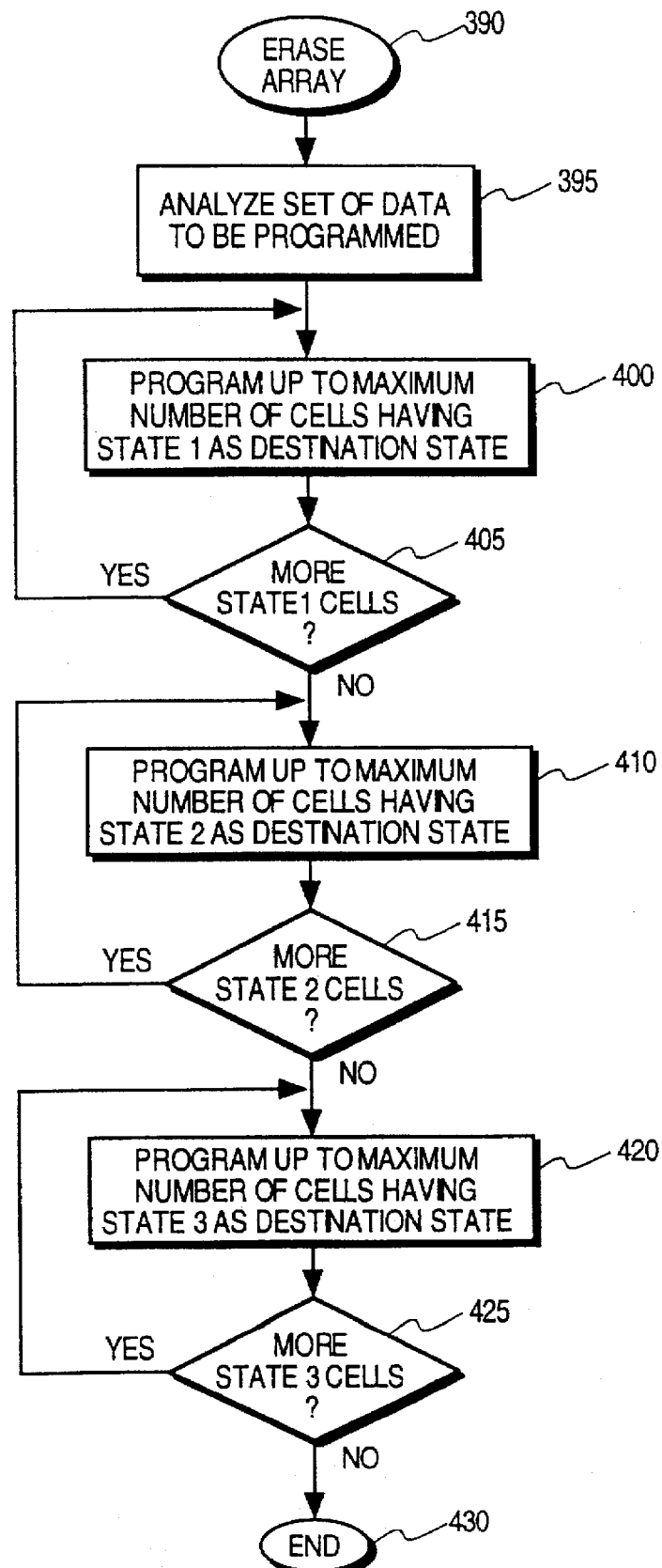
FIG. 16 shows a data stream analysis method of programming according to one embodiment.

Programming time can be reduced by analyzing the stream of data to be programmed to ensure that up to the maximum number of memory cells (i.e., a full block) are programmed at each programming cycle. FIG. 16 if a flow chart of a data stream analysis method according to one embodiment. Control engine 150 erases the array at process block 390. At process block 395, control engine 150 analyzes the set of data to be programmed into the memory array to determine which memory cells are to be programmed to which state and which memory cells are to remain in the erased state. Analysis of the data stream may be performed externally to memory device 120 and the analysis sent to control engine 150 such that control engine 150 may appropriately control programming of memory cell array.

Once the data stream has been analyzed, programming begins at process block 400, wherein control engine 150 programs up to a maximum number of cells having State 1 as their destination state. For example, if the number of cells to be programmed is determined by the number of bits in a block of memory, control engine 150 ensures that a full block of memory cells having State 1 as their destination are programmed at process block 400. If the number of cells having a destination state of State 1 is less than the maximum number, all of the cells are programmed at process block 400. Programming may be performed using any of the previously described methods.

If at process block 405 additional cells have State 1 as their destination state, process block 400 is repeated. Otherwise control engine 150 ensures that a maximum number of cells having State 2 as their destination state are programmed at process block 410. At process block 415, if additional cells having State 2 as their destination state exist, control engine 150 repeats the step of process block 410 until all such cells are programmed.

At process block 420, control engine 150 ensures that up to a maximum number of cells having State 3 as their destination state are programmed. At process block 425, control engine 150 determines whether additional State 3 cells need to be programmed. If not, the process ends at process block 430.

Figure 17:
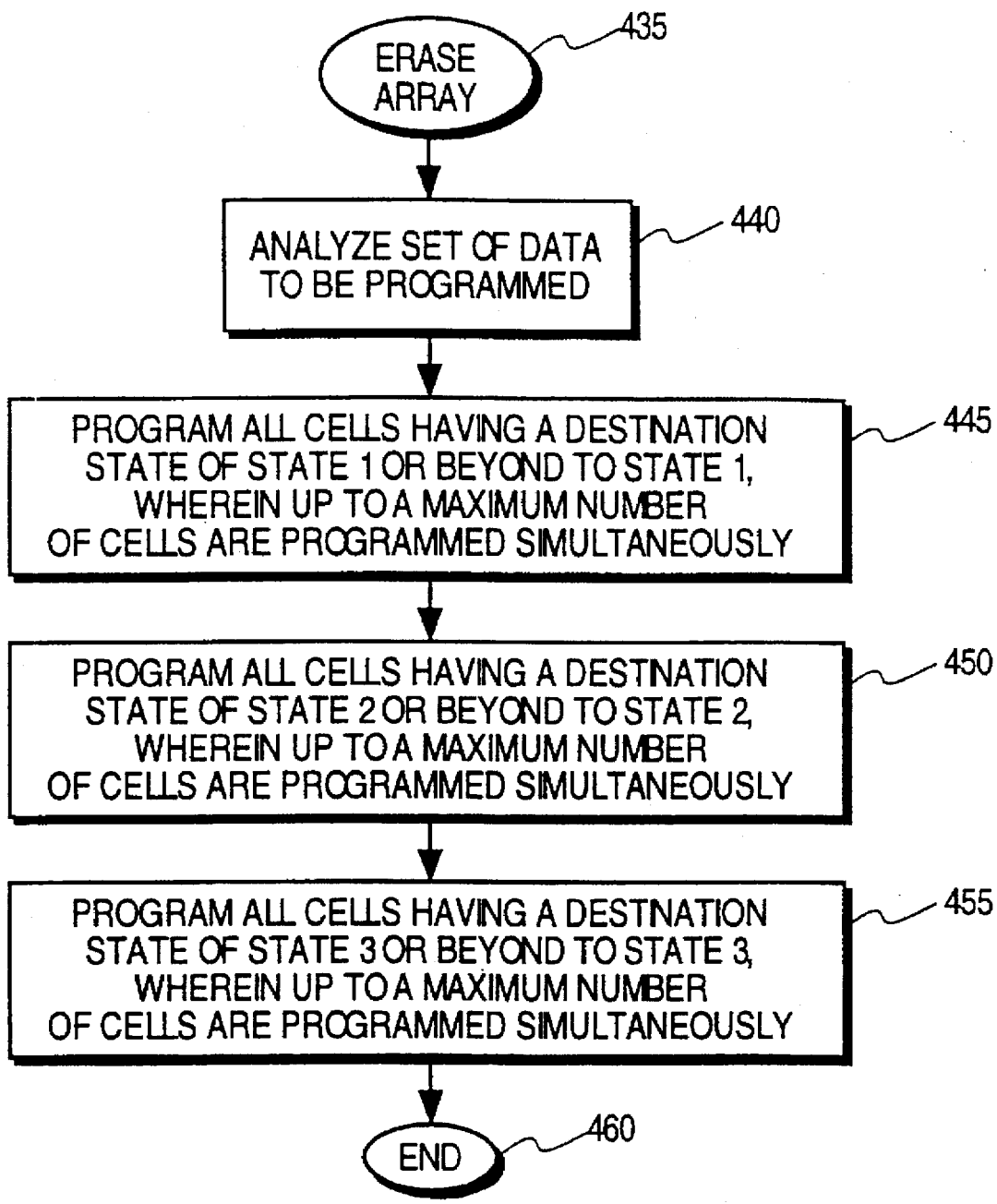
FIG. 17 shows a data stream analysis method according to an alternative embodiment.

FIG. 17 shows an alternative data stream analysis method wherein memory cells having differing destination states are programmed simultaneously. The programming method of FIG. 17 recognizes that cells programmed to a destination state beyond a first program state must "pass through" the first programmed state. The process begins at process block 435 wherein control engine 150 erases the memory cell array. At process block 440, control engine 150 analyzes the set of data to be programmed. Control engine 150 ignores cells that are to remain in the erased state or State 0. At process block 445, control engine 150 programs all cells having a destination state of State 1 or beyond to State 1, wherein up to a maximum number of cells are programmed simultaneously. Thus, some cells having a destination state of State 2, State 3, etc. are initially programmed to State 1. Process block 450 control engine programs all cells having a destination state of State 2 or beyond to State 2. Again, up to a maximum number of cells are programmed simultaneously. At process block 455, control engine 150 programs all cells having a destination state of State 3 or beyond to State 3. Again, up to a maximum number of cells are programmed simultaneously. The process ends at process block 460. If a memory cell may achieve more than four analog states, the process of FIG. 17 may be readily modified. The processes shown in FIGS. 16 and 17 may also be modified to provide data stream analysis programming for normal single-bit per cell memory arrays.

Programming by data stream analysis depends on which cells are to be programmed, and programming may be independent of the physical correspondence of the array to memory locations defined by the write buffer. Because the block of memory cells that are programmed during a single programming cycle will not have a defined relationship (e.g. each bit is not a bit of a single addressable byte or word of data), the array decoding of memory device 120 is modified to allow individual addressing of cells in the array such that a block of memory cells may be programmed per programming cycle without regard to their relative physical location to one another within the array.

A number of alternative methods and mechanisms may be used to provide data stream analysis. For example, data stream analysis may be done "on the fly" wherein the control engine scans the write buffer and selects memory locations for programming until a block of memory cells have been selected, whereupon that block of memory cells is programmed. Alternatively, data stream analysis may be done such that the addresses of the memory cells that are to be programmed to the same destination state are identified, sorted, and commonly stored such that the control engine can sequentially select blocks of data for programming one after another without the overhead of scanning the write buffer between programming cycles.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A nonvolatile memory system comprising:
an array of memory cells;
a write buffer that stores data to be programmed into corresponding memory cells of the array; and
a control engine coupled to the write buffer and the array of memory cells, the control engine analyzing the data stored by the write buffer to identify a plurality of memory cells to be programmed to a same destination state, the control engine programming the plurality of memory cells to the same destination state a block at a time, the block specifying a maximum number of memory cells that can be programmed at a time, until fewer than a block of memory cells remain to be programmed such that the maximum number of memory cells are programmed per programming cycle.

2. The nonvolatile memory system of claim 1, wherein the memory cells are each capable of achieving at least three states including an erased state and at least two programmed states.

3. The nonvolatile memory system of claim 1, wherein the control engine programs the subset of memory cells to the same destination state a block at a time regardless of relative physical locations of the memory cells within the array.

4. A nonvolatile memory system comprising:
an array of memory cells;
means for analyzing a set of data to be programmed into the array of memory cells to determine destination states for each of the memory cells in the array; and
means for directly programming, in a single programming cycle, a plurality of memory cells to be programmed to a particular destination state, up to a maximum number of memory cells being programmed at any given time, until the plurality of memory cells having the particular destination state is directly programmed without performing a verify operation, whereupon all memory cells to be programmed to a next destination state are programmed in a like manner.

5. The nonvolatile memory system as claimed in claim 4, further comprising:
means for sorting the set of data into subsets of data corresponding to common destination states; and
means for selecting a first subset of data corresponding to the particular destination state for programming, wherein the step of the control engine programming the plurality of memory cells to be programmed to the particular destination state is performed.

6. The nonvolatile memory system as claimed in claim 4, wherein the maximum number of memory cells corresponds to a block of memory, the means for programming the plurality of memory cells to be programmed to the particular destination state comprising means for programming up to a block of memory cells at a time regardless of relative physical locations of the memory cells within the array.

7. A nonvolatile memory system comprising:
means for analyzing a set of data to be programmed into the array of memory cells to determine destination states for each of the memory cells in the array;
means for erasing the array of memory cells; and
means for individually programming subsets of memory cells that have common destination states, wherein at least one of the subsets comprises greater than one memory cell.

8. The method of claim 7, wherein the programming means individually directly programs each subset of memory cells to their destination states without performing a verify operation.

9. A nonvolatile memory system comprising:
an array of individually addressable memory cells;
means for analyzing a set of data to be programmed into the array of memory cells to determine destination states for each of the memory cells in the array; and
means for simultaneously programming a block of memory cells to be programmed to a particular destination state regardless of relative physical locations of the memory cells within the array.

10. A method for programming an array of nonvolatile memory cells comprising:

analyzing a set of data to be programmed into the array of memory cells to determine destination states for each of the memory cells in the array; and a control engine directly programming, in a single programming cycle, a plurality of memory cells to be programmed to a particular destination state, up to a maximum number of memory cells being programmed at any given time, until the plurality of memory cells having the particular destination state is directly programmed without performing a verify operation, whereupon all memory cells to be programmed to a next destination state are programmed in a like manner.

11. The method as claimed in claim 10, further comprising the steps of:

sorting the set of data into subsets of data corresponding to common destination states; and selecting a first subset of data corresponding to the particular destination state for programming, wherein the step of the control engine programming the plurality of memory cells to be programmed to the particular destination state is performed.

12. The method as claimed in claim 10, wherein the maximum number of memory cells corresponds to a block of memory, the step of the control engine programming the plurality of memory cells to be programmed to the particular destination state comprises the control engine programming up to a block of memory cells at a time regardless of relative physical locations of the memory cells within the array.

13. A method for programming an array of nonvolatile memory cells comprising:

erasing the array of memory cells;

analyzing a set of data to be programmed into the array of memory cells to determine destination states for each of the memory cells in the array; and individually programming subsets of memory cells that have common destination states, wherein at least one of the subsets comprises greater than one memory cell.

14. The method of claim 13 wherein the step of individually programming each subset of memory cells comprises programming a maximum number of memory cells at a time until fewer than a maximum number of memory cells having the common destination state of that subset remain to be programmed.

15. The method of claim 13, wherein the programming step comprises individually directly programming each subset of memory cells to their destination states without performing a verify operation.

16. A method for programming an array of individually addressable nonvolatile memory cells comprising:

analyzing a set of data to be programmed into the array of memory cells to identify a subset of memory cells that are to be programmed to a same destination state; and a control engine programming the subset of memory cells to the same destination state a block at a time regardless of relative physical locations of the memory cells within the array.

* * * * *